(12) United States Patent
Shaharyar et al.

(10) Patent No.: US 12,266,510 B2
(45) Date of Patent: Apr. 1, 2025

(54) PLASMA TREATMENT DEVICE

(71) Applicant: Clean Crop Technologies, Inc., Holyoke, MA (US)

(72) Inventors: Yaqoot Shaharyar, Northampton, MA (US); Shardul Sreekumar, Easthampton, MA (US); Michael DiFrancesco, Waterbury, CT (US); Dominik Laszczkowski, Easthampton, MA (US); Madhukar Prasad, Amherst, MA (US); Sandon Hess, Northampton, MA (US); Rachael Useted, Belchertown, MA (US)

(73) Assignee: Clean Crop Technologies, Inc., Holyoke, MA (US)

( * ) Notice: Subject to any disclaimer, the term of this patent is extended or adjusted under 35 U.S.C. 154(b) by 95 days.

(21) Appl. No.: 18/178,959

(22) Filed: Mar. 6, 2023

(65) Prior Publication Data
US 2023/0290617 A1 Sep. 14, 2023

Related U.S. Application Data

(60) Provisional application No. 63/317,952, filed on Mar. 8, 2022.

(51) Int. Cl.
*H01J 37/32* (2006.01)

(52) U.S. Cl.
CPC .... *H01J 37/32568* (2013.01); *H01J 37/3233* (2013.01); *H01J 37/3244* (2013.01); *H01J 37/3255* (2013.01); *H01J 37/32733* (2013.01)

(58) Field of Classification Search
CPC ............... H01J 37/3233; H01J 37/3244; H01J 37/3255; H01J 37/32348; H01J 37/32568; H01J 37/32733; H05H 1/2406
See application file for complete search history.

(56) References Cited

U.S. PATENT DOCUMENTS

| | | | | |
|---|---|---|---|---|
| 5,162,633 A | * | 11/1992 | Sonobe | H01J 37/32697 204/298.37 |
| 5,686,789 A | * | 11/1997 | Schoenbach | H01J 17/04 313/574 |
| 11,266,003 B2 | * | 3/2022 | Mujahid | H05H 1/2406 |
| 2004/0022669 A1 | * | 2/2004 | Ruan | A61M 1/32 422/22 |
| 2004/0221958 A1 | * | 11/2004 | Loewenhardt | H01J 37/32137 156/345.47 |

(Continued)

FOREIGN PATENT DOCUMENTS

WO 2020255100 A1 12/2020

*Primary Examiner* — Tung X Le
(74) *Attorney, Agent, or Firm* — COOLEY LLP

(57) ABSTRACT

A plasma treatment device is provided and includes a first electrode, a dielectric body supportive of the first electrode and a second mesh electrode having an opposite polarity as the first electrode and comprising a seating portion. The second mesh electrode is disposed proximate to the dielectric body to define a gap receptive of particles for collection in the seating portion. The gap is sized such that, with the second mesh electrode activated, a plasma field is generated to treat the particles in the seating portion. The seating portion is configured to retain the particles during treatment in opposition to ionic winds resulting from the plasma field.

20 Claims, 7 Drawing Sheets

(56) References Cited

U.S. PATENT DOCUMENTS

| | | | |
|---|---|---|---|
| 2008/0023317 A1* | 1/2008 | Malik | H05H 1/2406 |
| | | | 204/164 |
| 2011/0108726 A1* | 5/2011 | Hiraoka | H01J 49/142 |
| | | | 250/288 |
| 2015/0137677 A1* | 5/2015 | Sohn | H01T 19/04 |
| | | | 313/268 |

* cited by examiner

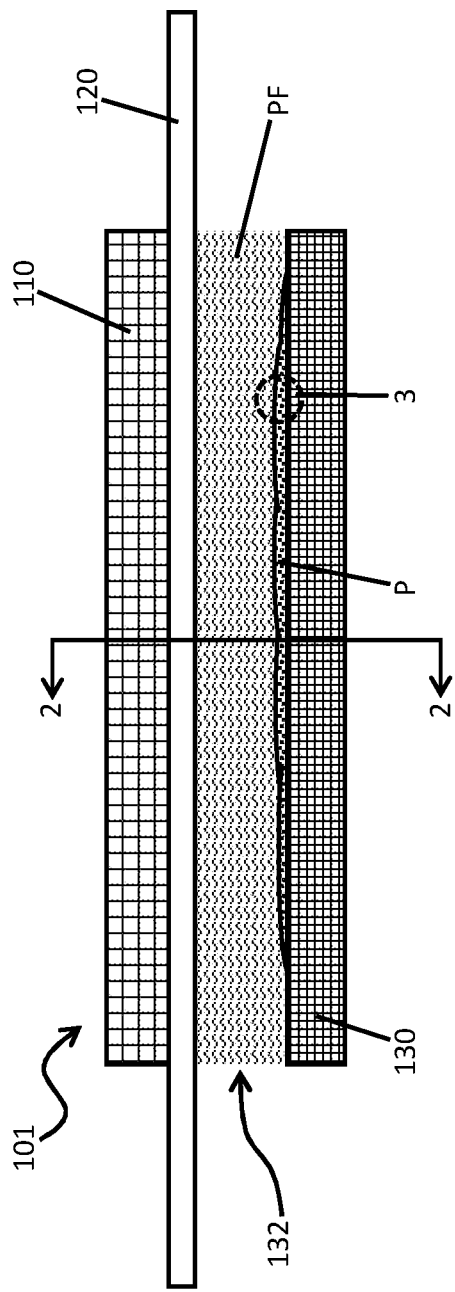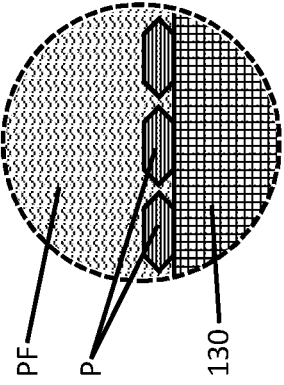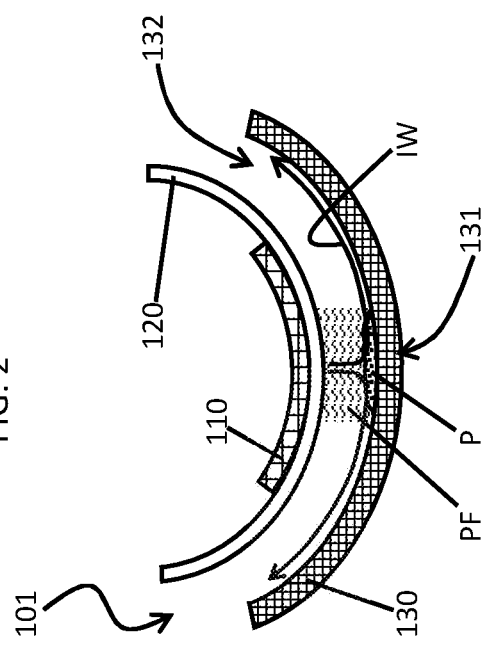

901: Dispensing particles into gap such that particles collect in seating portion 902: Disposing mesh electrode including seating portion proximate to dielectric body supportive of first electrode to define gap receptive of particles for collection in seating portion 903: Dispensing particles into gap such that particles collect in seating portion 904: Activating mesh electrode to generate plasma field to treat particles in seating portion 905: Pouring treated particles out of seating portion and gap following treatment

PLASMA TREATMENT DEVICE

CROSS-REFERENCE TO RELATED APPLICATIONS

This application is based on and claims priority to U.S. Provisional Patent Application No. 63/317,952, filed on Mar. 8, 2022, and all the benefits accruing therefrom under 35 U.S.C. § 119, the contents of which are incorporated by reference herein in their entirety.

BACKGROUND

The following description relates to a high-voltage atmospheric pressure dielectric barrier discharge (DBD) reactor that can provide a plasma dose delivery in an infield treatment for disinfection and surface modification of light and powdery substrates.

Substrates with relatively small masses like powders (e.g., spices, inorganic/organic materials, etc.) and certain seeds can benefit from plasma treatment. Cold plasma treatment in particular is an effective way to disinfect and functionalize the surfaces of these substrates. Indeed, the influence of a cold plasma treatment of various types of seeds can increase the surface area of the seeds and hence the water uptake capacities thereof. Moreover, the chemical action of plasma can expose these seeds to reactive species which can increase the maldonaldehyde (MDA), a product of lipid peroxidation as well as influence the seed coat pigmentation which can influence seed permeability. This has the result of improving germination among other advantages (it has been further demonstrated that plasma treated seeds display enhanced germination rates as well as increased biomass (root length and shoot length) compared to untreated seeds).

High-voltage atmospheric pressure plasma (>25 kV peak voltage at 1 atm) can be a particularly industrially relevant technology for such substrate/seed treatments. The application of high voltages presents multiple advantages including, but not limited to, a higher power density for a given capacitive load and increased electron density which decreases the required residence time for optimal treatment. Moreover, higher voltages are preferred for infield treatments which are important for direct surface functionalization (like seed scarification) because of the ability to increase the discharge gap (beyond a few millimeters that are possible at relatively lower voltages). This allows a more commercially viable treatment zone for a wide range of substrates as well as the ability to modulate discharge parameters like streamer density as a function of the discharge gap. While not only desirable from a commercialization perspective, but it has also been found that lowered residence times enable relatively efficient decoupling between plasma induced surface functionalization and exposure to reactive oxygen and nitrogen species (particular ROS and RNS with longer half-lives like $O_3$) thus providing better process control. Enhanced voltages also unlock other useful chemical pathways which are otherwise unavailable at lower voltages. For example, in air, increasing voltages increases a rate of the production of NOx species which can be a beneficial disinfectant as well as a source of nitrogen for seeds.

BRIEF DESCRIPTION

According to an aspect of the disclosure, a plasma treatment device is provided and includes a first electrode, a dielectric body supportive of the first electrode and a second mesh electrode having an opposite polarity as the first electrode and comprising a seating portion. The second mesh electrode is disposed proximate to the dielectric body to define a gap receptive of particles for collection in the seating portion. The gap is sized such that, with the second mesh electrode activated, a plasma field is generated to treat the particles in the seating portion. The seating portion is configured to retain the particles during treatment in opposition to ionic winds resulting from the plasma field.

In accordance with additional or alternative embodiments, the particles include at least one of seeds and powder particles.

In accordance with additional or alternative embodiments, the second mesh electrode is operable at 10-500 kV/cm and with power densities ranging from 0.1-10 W/cm2.

In accordance with additional or alternative embodiments, a thickness of the gap is at least 3 times a thickness of the particles.

In accordance with additional or alternative embodiments, the second mesh electrode is porous to the ionic winds and to abnormally small or partial ones of the particles and impermeable to the particles.

In accordance with additional or alternative embodiments, the second mesh electrode is curved and the seating portion is defined at a lowermost curvature section.

In accordance with additional or alternative embodiments, the dielectric body is a tubular element with the first electrode supported on an interior surface thereof and the second mesh electrode disposed to define the gap about an exterior surface thereof and the plasma treatment device further includes ribs configured to support the second mesh electrode.

In accordance with additional or alternative embodiments, an additional electrode assembly is supported on the ribs and configured to generate an additional plasma field to drive particles escaping the seating portion back to the seating portion.

In accordance with additional or alternative embodiments, surface discharge electrodes are supported on the ribs and configured to generate axial plasma fields to axially constrain the particles in the seating portion.

In accordance with additional or alternative embodiments, a solid electrode is supported on the ribs about the second mesh electrode to redirect the ionic winds.

In accordance with additional or alternative embodiments, a dispensing system is configured to dispense the particles into the gap and a servo assembly rotates at least the dielectric body and the second mesh electrode between dispensing and tilted positions.

According to an aspect of the disclosure, a plasma treatment device is provided and includes a first electrode, a second electrode having an opposite polarity as the first electrode, a non-conductive mesh with a seating portion and at least one dielectric body supportive of the first electrode or interposed between the second electrode and the non-conductive mesh. The seating portion of the non-conductive mesh is configured to collect particles, the first and second electrodes is arranged such that, with the second electrode activated, a plasma field is generated to treat the particles in the seating portion and the seating portion is configured to retain the particles during treatment in opposition to ionic winds resulting from the plasma field.

In accordance with additional or alternative embodiments, the at least one dielectric body is supportive of the first electrode.

In accordance with additional or alternative embodiments, the at least one dielectric body is interposed between the second electrode and the non-conductive mesh.

In accordance with additional or alternative embodiments, the at least one dielectric body includes a first dielectric body, which is supportive of the first electrode and a second dielectric body, which is interposed between the second electrode and the non-conductive mesh.

In accordance with additional or alternative embodiments, the particles include at least one of seeds and powder particles and the second electrode is operable at 10-500 kV/cm and with power densities ranging from 0.1-10 W/cm2.

In accordance with additional or alternative embodiments, the non-conductive mesh is impermeable to the particles and porous to the ionic winds and to abnormally small or partial ones of the particles.

According to an aspect of the disclosure, a method of operating a plasma treatment device is provided and includes supporting a first electrode on a dielectric body, disposing a second mesh electrode having an opposite polarity from the first electrode and including a seating portion proximate to the dielectric body to define a gap receptive of particles for collection in the seating portion, dispensing the particles into the gap such that the particles collect in the seating portion, activating the second mesh electrode to generate a plasma field to treat the particles in the seating portion, the seating portion being configured to retain the particles during treatment in opposition to ionic winds resulting from the plasma field and pouring treated particles out of the seating portion and the gap following the treatment.

In accordance with additional or alternative embodiments, the dispensing includes arranging the gap beneath a dispenser and opening the dispenser.

In accordance with additional or alternative embodiments, the pouring of the treated particles out of the seating portion includes rotating at least the dielectric body and the second mesh electrode from a dispensing position to a tilted position.

These and other advantages and features will become more apparent from the following description taken in conjunction with the drawings.

BRIEF DESCRIPTION OF THE DRAWINGS

The subject matter, which is regarded as the disclosure, is particularly pointed out and distinctly claimed in the claims at the conclusion of the specification. The foregoing and other features and advantages of the disclosure are apparent from the following detailed description taken in conjunction with the accompanying drawings in which:

FIG. 1 is a schematic side view of a plasma treatment device in accordance with embodiments;

FIG. 2 is a cross-sectional view of the plasma treatment device of FIG. 1 taken along line 2-2 of FIG. 1 in accordance with embodiments;

FIG. 3 is an enlarged side view of particles being treated in the plasma treatment device of FIG. 1 taken from encircled portion 3 of FIG. 1 in accordance with embodiments;

FIG. 9 is a flow diagram illustrating a method of operating a plasma treatment device in accordance with embodiments.

Figure 4:
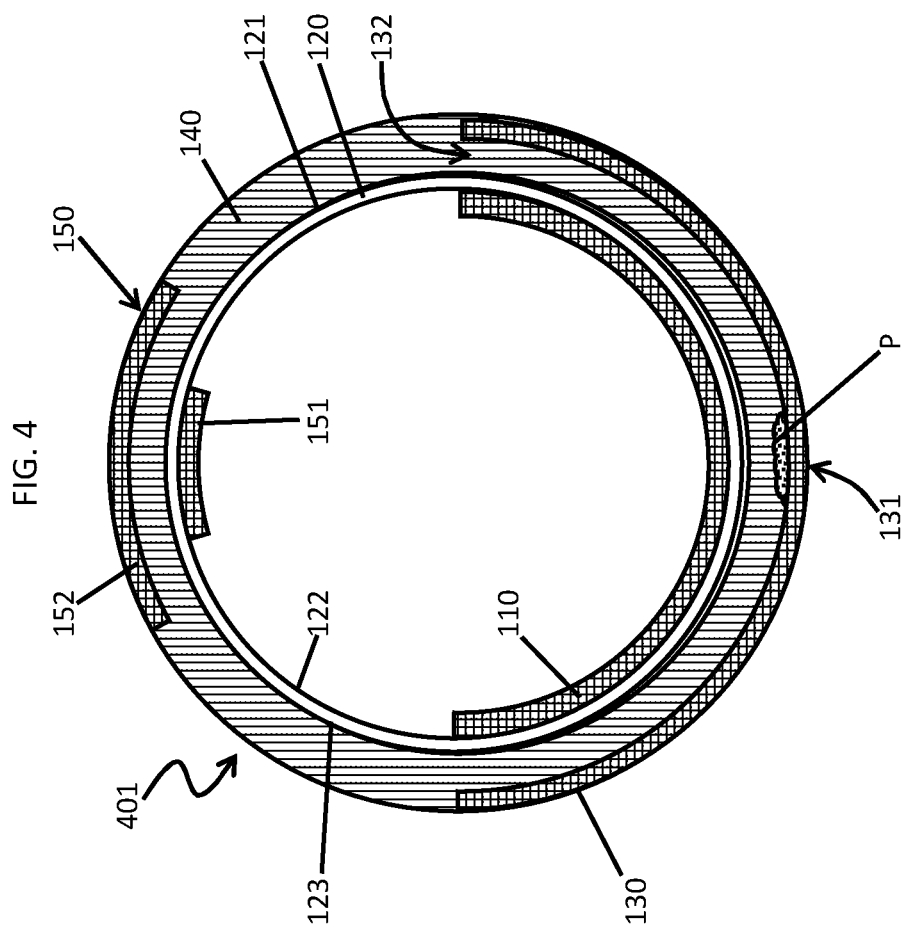
FIG. 4 is a schematic axial view of a plasma treatment device in accordance with embodiments.

These and other advantages and features will become more apparent from the following description taken in conjunction with the drawings.

DETAILED DESCRIPTION

Although high-voltage plasm treatments can present certain advantages, the high-voltage regime can present significant challenges due to electrohydrodynamic forces or the so called 'ionic winds' generated during plasma treatments. Particularly in the case of lighter and smaller substrates, the ionic winds can cause massive displacements during treatment processes and can push at least a portion of the substrates out of the plasma field. This can result in an irregular and sometimes completely ineffective treatment.

Thus, as will be described below, a high-voltage (HV) dielectric barrier discharge (DBD) plasma reactor is provided with geometries and process conditions that improve a uniformity of plasma dosage for substrates that would be otherwise adversely affected by the action of plasma-induced electrohydrodynamic forces. The HV DBD plasma reactor can be operated with sufficient reliability between about 10-500 kV/cm and with power densities ranging from about 0.1-10 W/cm2. The HV DBD plasma reactor can be operated in air or any other reactant gas chemistry including, but not limited to, N2, O2, CO2, CO, H2, NH3, or any combinations thereof.

That is, a plasma treatment device is provided and includes a mesh having a seating portion and an electrode assembly. The seating portion is configured to seat particles, such as seeds and powder particles. The electrode assembly is configured to generate a plasma field to treat the particles, with the particles seated in the seating portion. The seating portion is configured to retain the particles during the treatment in opposition to ionic winds (IW) generated by the plasma field.

With reference to FIGS. 1-3, a plasma treatment device 101 is provided and includes a ground or first electrode 110, a dielectric body 120 that is supportive of the first electrode 110 and a second mesh electrode 130. The first electrode 110 has a first polarity and the second mesh electrode 130 has a second polarity which is opposite the first polarity. The second mesh electrode 130 includes a seating portion 131 (see FIG. 2) and is disposed proximate to the dielectric body 120 to define a gap 132 between the dielectric body 120 and the second mesh electrode 130. The gap 132 is receptive of particles P, such as at least one of seeds and powder particles, so that the particles P can collect in the seating portion 131. The gap 132 is sized such that, with the second mesh electrode 130 activated, a plasma field PF is generated to treat the particles P in the seating portion 131. The seating portion 131 is configured to retain the particles P during the treatment of the particles P by the plasma field PF in opposition to ionic winds IW which result from the plasma field PF.

A thickness of the gap 132 can be at least 3 times a thickness of the particles P seated on the seating portion 131. In some cases, the gap 132 can be up to 3 cm thick.

The first electrode 110 and the second mesh electrode 130 cooperatively form an electrode assembly 135 that is configured and operable as a high-voltage (HV) dielectric barrier discharge (DBD) plasma reactor. This HV DBD plasma reactor is operable at 10-500 kV/cm and with power densities ranging from 0.1-10 W/cm2 in air or any other reactant gas chemistry including, but not limited to, $N_2$, $O_2$, $CO_2$, CO, $H_2$, $NH_3$ or any combinations thereof. The first electrode 110 and the second mesh electrode 130 can be formed of metals like aluminum (Al), copper (Cu), silver (Ag), tungsten (W), titanium (Ti), etc., or metallic materials.

The dielectric body 120 can be formed of a glass like pyrex or fused silica (SiO2) or a ceramic material like alumina (Al2O3), silicon carbide (SiC), silicon nitride (SiN) or Mica (Muscovite). Polymeric materials like polycarbonate, high density polyethylene, kapton or PEEK can also be used as a dielectric material. A thickness of the dielectric body 120 can be about 0.05-1 cm and can be varied to control a nature and intensity of plasma discharge.

The second mesh electrode 130 can be provided with a mesh that has open interstitial regions of about 10-70% of its total surface area. As such, the second mesh electrode 130 is porous to the ionic winds 1W resulting from the plasma field PF and to abnormally small or partial ones of the particles P while being impermeable to the particles P that are not abnormally small or broken into pieces. Employing the second mesh electrode 130 as opposed to a solid electrode reduces a velocity drop of the ionic winds 1W in a direction normal to the seeds (or powdery substrates). That is, in a conventional plasma reactor, when the ionic winds IW originating from one electrode reach a solid electrode or a solid dielectric material, the velocity of the ionic winds IW in the normal direction at that surface essentially drops to zero causing a significant increase in pressure. Therefore, ionic wind velocity in axial (+/−x directions) increases significantly thus dragging light/powdery substrates and results in significant non-uniformity in plasma dosages to the substrate. The second mesh electrode 130 described herein addresses this problem and reduces the velocity drop at the face of the second mesh electrode 130 and only creates high pressure areas at the top of the substrate. This causes the substrate (i.e., the particles P) to maintain position under electrohydrodynamic ionic winds IW resulting in a uniform plasma treatment.

With the second mesh electrode 130 being porous to the ionic winds IW resulting from the plasma field PF and to abnormally small or partial ones of the particles P while being impermeable to the particles P that are not abnormally small or broken into pieces, the second mesh electrode 130 effectively serves as a filter of the particles P by allowing those particles P which are not normally sized or broken to pass through the open interstitial regions.

Figure 5:
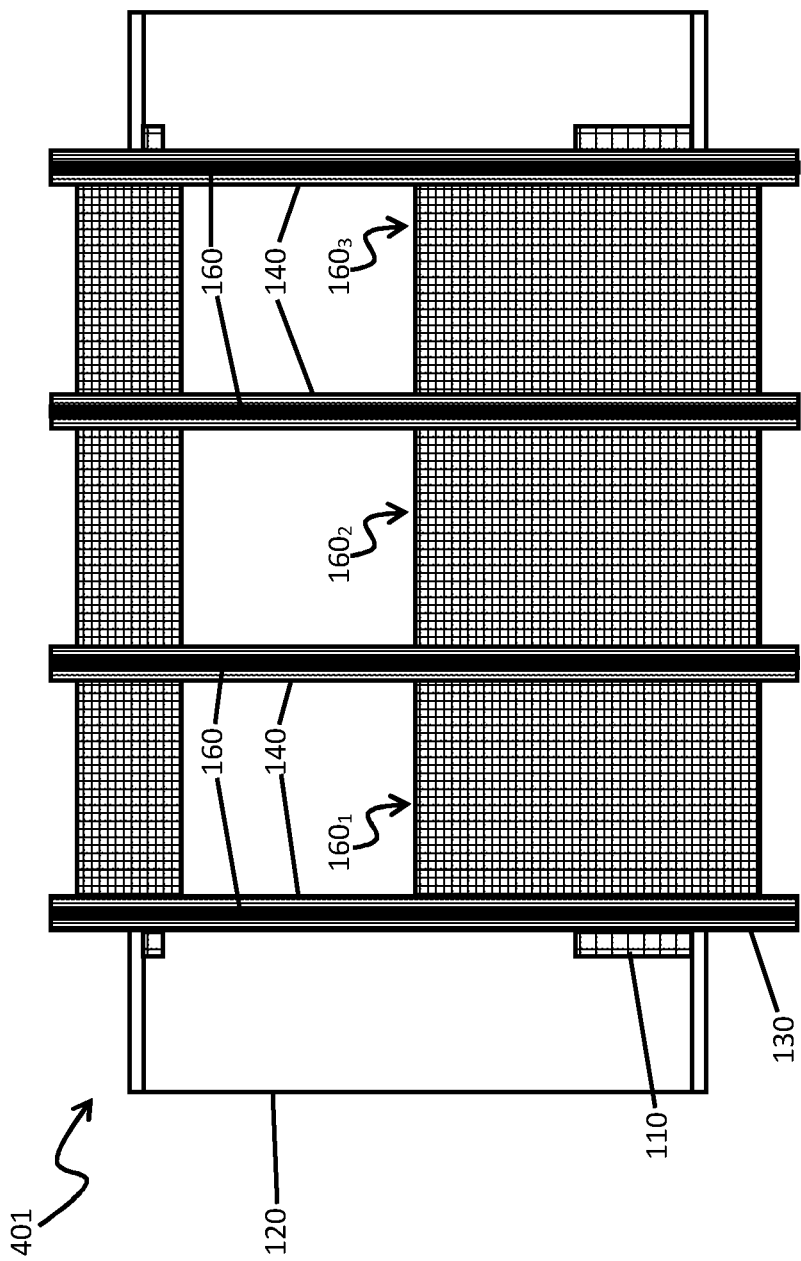
FIG. 5 is a schematic side view of the plasma treatment device of FIG. 4 in accordance with embodiments.
Figure 6:
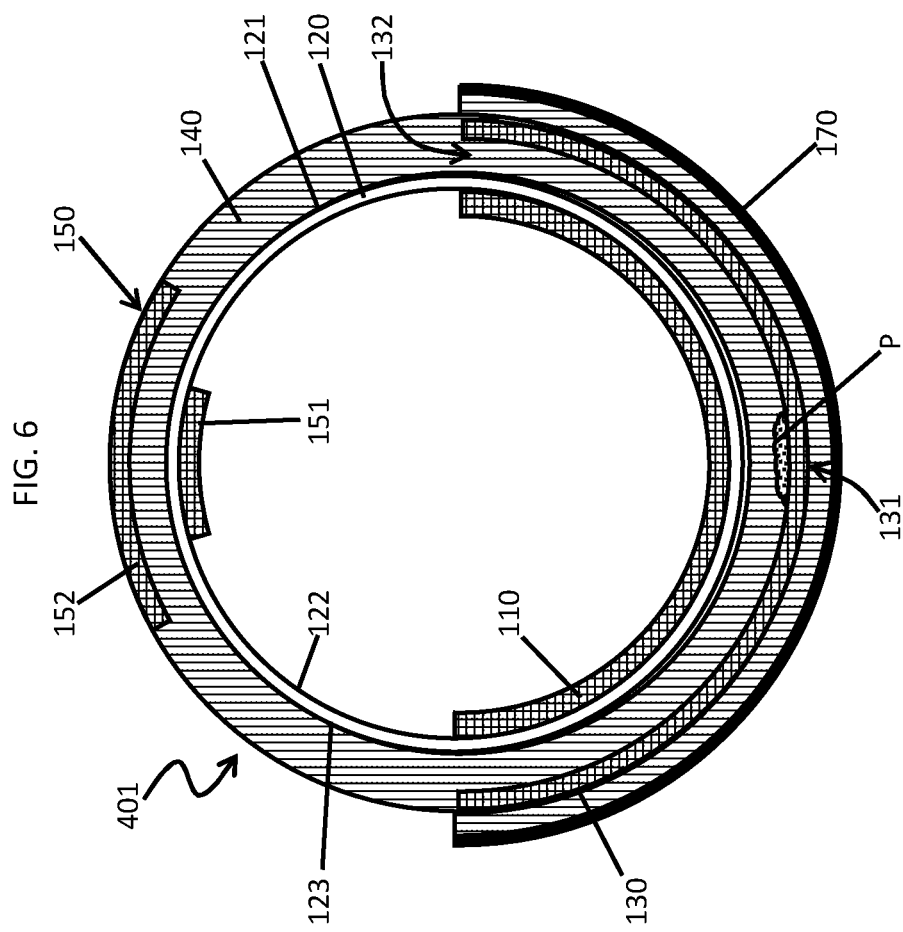
FIG. 6 is a schematic axial view of a plasma treatment device in accordance with further embodiments.

With reference to FIGS. 4-6 and in accordance with additional or alternative embodiments, a plasma treatment device 401 will now be described. Elements common to both the plasma treatment device 101 of FIGS. 1-3 and the plasma treatment device 401 of FIGS. 4-6 will continue to be identified by the same reference numerals and need not be re-described in detail except as provided below.

As shown in FIG. 4, the second mesh electrode 130 can be curved and the seating portion 131 can be defined at a lowermost curvature section of the second mesh electrode 130. In these or other cases, the dielectric body 120 can include or be provided as a cylinder or tubular element 121 with an interior surface 122 and an exterior surface 123, and with the first electrode 110 supported in a curved condition on the interior surface 122. The second mesh electrode 130 can be similarly provided as a partial or half cylinder and can be disposed about the exterior surface 123 to define the gap 132 as an annular or partially annular gap for the circumferential length of the second mesh electrode 130. One or more ribs 140 can be provided to support at least the second mesh electrode 130. The coaxial geometry of the dielectric body 120 and the second mesh electrode 130 effectively constricts undesirable motions of the particles P relative to the seating portion 131. In particular, the particles P are prevented or inhibited from traveling upwardly along the second mesh electrode 130 by the curvature of the second mesh electrode 130.

In accordance with embodiments, where the dielectric body 120 is a cylinder or tubular element 121, the ribs 140 can be provided as multiple (e.g., four) parallel ribs that extend entirely about the dielectric body 120 to support the second mesh electrode 130. In these or other cases, the ribs 140 can form channels in the gap 132 for the particles to flow into and collect in the seating portion 131.

The plasma treatment device 401 can also include an additional electrode assembly 150. This additional electrode assembly 150 can include a first electrode 151 disposed on an uppermost portion of the interior surface 121 and a second mesh or solid electrode 152 supported on the ribs 140 proximate to the uppermost portion of the exterior surface 122. When activated, this additional electrode assembly 150 can be configured to generate an additional plasma field whose resultant ionic winds IW tend to drive particles P, which are escaping the seating portion 131 along the circumferential direction, back toward the seating portion 131.

With reference to FIG. 5, which is a side view of the plasma treatment device 401 of FIG. 4, the plasma treatment device 401 can also include surface discharge electrodes 160. These surface discharge electrodes 160 are supported on the ribs 140 and configured to generate axial plasma fields to axially constrain the particles P in the seating portion 131. As shown in FIG. 5, in the case of the plasma treatment device 401 including four ribs 140 with two outermost ribs and two interior ribs, the surface discharge electrodes 160 can provide for three treatment zones $160_1$, $160_2$ and $160_3$ between neighboring pairs of the four ribs 140.

With reference to FIG. 6, the plasma treatment device 401 can also include a solid electrode 170. The solid electrode 170 can be supported on the ribs 140 about the second mesh electrode 130 at a distance from the second mesh electrode 130. In this position, as ionic winds IW pass through the second mesh electrode 130 the ionic winds IW impinge upon the solid electrode 170 in a normal direction and are redirected in the axial or circumferential directions. This redirection of the ionic winds IW created a pressure on the particles P that tends to constrain the particles P in the seating portion 131.

In greater detail, the solid electrode 170 can be placed at approximately 1-5 mm to the second mesh electrode 130 and enables a recirculatory pathway for accelerated reactive species. The ionic winds IW move through the second mesh electrode 130 with some loss in velocity and reach the solid electrode 170 creating recirculation which forms a high-pressure zone at the edges of the second mesh electrode 130 causing the particles P to be pushed inwards rather than outwards. This arrangement enables the maintenance of an atmosphere rich in reactive oxygen and nitrogen species.

Although the embodiments of FIGS. 1-3 and the embodiments of FIGS. 4-6 are presented separately, it is to be understood that they are interchangeable and combinable with one another in various combinations and permutations. For example, the additional electrode assembly 150 of FIG. 4 can be paired with either or both of the surface discharge electrodes 160 of FIG. 5 and the solid electrode 170 of FIG. 6 in order to most effectively constrain the particles P in the seating portion 131.

Figure 7:
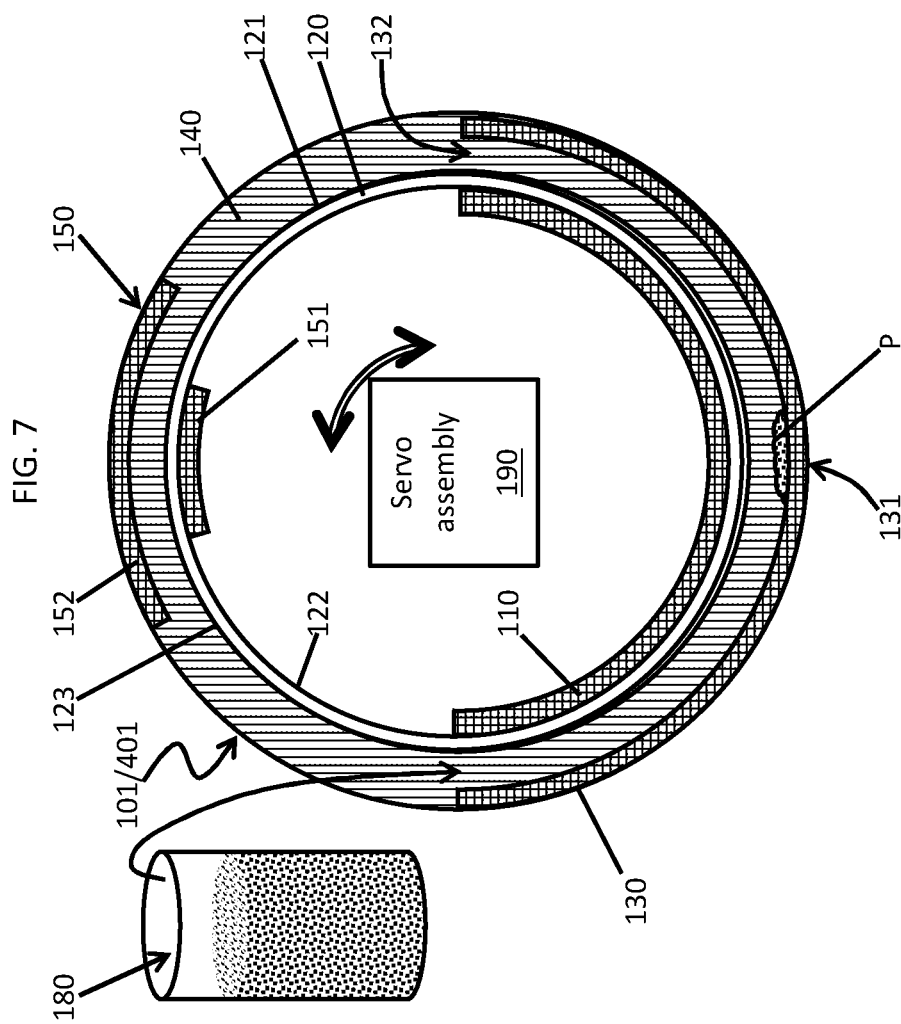
FIG. 7 is a schematic axial view of a plasma treatment device, a dispensing system and a servo assembly in accordance with embodiments.

With reference to FIG. 7, the plasma treatment device 101 of FIGS. 1-3 and the plasma treatment device 401 of FIGS. 4-6 can also include a dispensing system 180 and a servo assembly 190. The dispensing system 180 can include buckets that can be opened above the gap 132 in order to dispense the particles P into the gap 132. The servo assembly 190 can be configured to rotate at least the dielectric body 120 and the second mesh electrode 130 between a dispensing position at which the dispensing system 18 can dispense the particles P into the gap 132 and tilted positions at which treated particles P can be poured out from the seating portion 131 and the gap 132.

Figure 8:
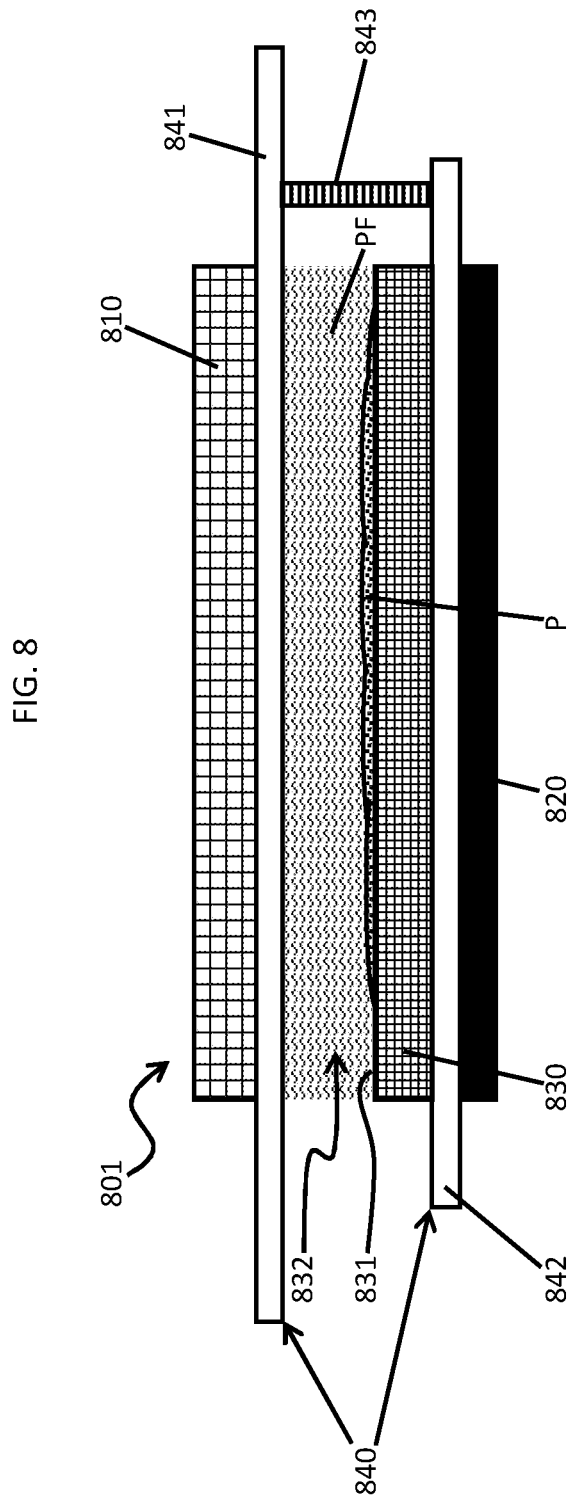
FIG. 8 is a schematic side view of a plasma treatment device in accordance with alternative embodiments.

With reference to FIG. 8 and in accordance with additional or alternative embodiments, a plasma treatment device 801 will now be described. Elements common to the plasma treatment device 101 of FIGS. 1-3, the plasma treatment device 401 of FIGS. 4-6 (and FIG. 7) and the plasma treatment device 801 of FIG. 8 will continue to be identified by the same reference numerals and need not be re-described in detail except as provided below.

As shown in FIG. 8, plasma treatment device 801 is provided and includes a first electrode 810, a second electrode 820 having an opposite polarity as the first electrode 810, a non-conductive mesh 830 with a seating portion 831 and at least one dielectric body 840. The at least one dielectric body 840 is supportive of the first electrode 810 (generally as described above) or is interposed between the second electrode 820 and the non-conductive mesh 830. The second electrode 820 can be a solid or a mesh electrode and the non-conductive mesh 830 can be configured with open interstitial regions as described above.

While the at least one dielectric body 840 can be either supportive of the first electrode 810 (generally as described above) or interposed between the second electrode 820 and the non-conductive mesh 830, the embodiment of FIG. 8 illustrates a coaxial, dual dielectric body case in which the at least one dielectric body 840 includes a first dielectric body 841 that is supportive of the first electrode 810 and a second dielectric body 842, which is coaxial with the first dielectric body 841 and interposed between the second electrode 820 and the non-conductive mesh 830. Spacers 843 can be provided to support the first dielectric body 841 within the second dielectric body 842 so as to maintain a gap 832 for receiving the particles P.

The seating portion 831 of the non-conductive mesh 830 is configured to collect particles P. The first and second electrodes 810 and 820 are arranged such that, with the second electrode 820 activated, a plasma field PF is generated to treat the particles P in the seating portion 831. The seating portion 831 is configured to retain the particles P during treatment in opposition to ionic winds IW resulting from the plasma field PF.

With reference to FIG. 9, a method of operating a plasma treatment device, such as the plasma treatment device 101/401/801 described herein, is provided. As shown in FIG. 9, the method includes supporting a first electrode on a dielectric body (block 901), disposing a second mesh electrode having an opposite polarity from the first electrode and including a seating portion proximate to the dielectric body to define a gap receptive of particles for collection in the seating portion (block 902), dispensing the particles into the gap such that the particles collect in the seating portion (block 903) by arranging the gap beneath a dispenser and opening the dispenser, activating the second mesh electrode to generate a plasma field to treat the particles in the seating portion, the seating portion being configured to retain the particles during treatment in opposition to ionic winds resulting from the plasma field (block 904) and pouring treated particles out of the seating portion and the gap following the treatment (block 905) by rotating at least the dielectric body and the second mesh electrode from a dispensing position to a tilted position.

In accordance with further embodiments and as a way of increasing treatment uniformity, large particle quantities can be treated in smaller batches. In these or other cases, reactor geometries can be provided as multiple discontinuous reactors (like multiple coaxial tubes) in place of a singular larger reactor. The exact quantity of the particles treated per reactor depends on the particle type being treated but it is to be understood that multiple treatment zones can be placed on a single plasma treatment device 101 that can be fed and discharged separately to treat larger quantities of particles while maintaining very high plasma dosage uniformity.

Technical effects and benefits of the present disclosure are the provision of reactor systems that ensure that a uniform plasma dose is delivered to light and smaller substrates which would otherwise experience significant movement under the action of plasma-induced electrohydrodynamic forces. Restricting the motion of the substrates (i.e., seeds, powders, etc.) in plasma and utilization of smaller reactor volumes ensures that uniform exposure is maintained and hence any plasma-related effects like surface modification or disinfection are observed all across the treated substrate volume thereby increasing the value proposition of the process. Additionally, utilization of the above designs enables the use of direct high-voltage treatments that would not have been otherwise possible.

While the disclosure is provided in detail in connection with only a limited number of embodiments, it should be readily understood that the disclosure is not limited to such disclosed embodiments. Rather, the disclosure can be modified to incorporate any number of variations, alterations, substitutions or equivalent arrangements not heretofore described, but which are commensurate with the spirit and scope of the disclosure. Additionally, while various embodiments of the disclosure have been described, it is to be understood that the exemplary embodiment(s) may include only some of the described exemplary aspects. Accordingly, the disclosure is not to be seen as limited by the foregoing description, but is only limited by the scope of the appended claims.

What is claimed is:

1. A plasma treatment device, comprising:
a first electrode;
a dielectric body supportive of the first electrode; and
a second mesh electrode having an opposite polarity as the first electrode and comprising a seating portion, wherein:
the second mesh electrode is proximate to the dielectric body to define a gap receptive of particles for collection in the seating portion,
the gap is sized such that, with the second mesh electrode activated, a plasma field is generated to treat the particles in the seating portion, and
the seating portion is configured to retain the particles during treatment in opposition to ionic winds resulting from the plasma field.

2. The plasma treatment device according to claim 1, wherein the particles comprise at least one of seeds and powder particles.

3. The plasma treatment device according to claim 1, wherein the second mesh electrode is operable at 10-500 kV/cm and with power densities ranging from 0.1-10 W/cm$^2$.

4. The plasma treatment device according to claim 1, wherein a thickness of the gap is at least 3 times a thickness of the particles.

5. The plasma treatment device according to claim 1, wherein the second mesh electrode is porous to the ionic winds and to abnormally small or partial ones of the particles and impermeable to the particles.

6. The plasma treatment device according to claim 1, wherein the second mesh electrode is curved and the seating portion is defined at a lowermost curvature section.

7. The plasma treatment device according to claim 1, wherein:
the dielectric body is a tubular element with the first electrode supported on an interior surface thereof and the second mesh electrode disposed to define the gap about an exterior surface thereof, and
the plasma treatment device further comprises ribs configured to support the second mesh electrode.

8. The plasma treatment device according to claim 7, further comprising an additional electrode assembly supported on the ribs and configured to generate an additional plasma field to drive particles escaping the seating portion back to the seating portion.

9. The plasma treatment device according to claim 7, further comprising surface discharge electrodes supported on the ribs and configured to generate axial plasma fields to axially constrain the particles in the seating portion.

10. The plasma treatment device according to claim 7, further comprising a solid electrode supported on the ribs about the second mesh electrode to redirect the ionic winds.

11. The plasma treatment device according to claim 1, further comprising:
a dispensing system configured to dispense the particles into the gap; and
a servo assembly to rotate at least the dielectric body and the second mesh electrode between dispensing and tilted positions.

12. A plasma treatment device, comprising:
a first electrode;
a second electrode having an opposite polarity as the first electrode;
a non-conductive mesh with a seating portion; and
at least one dielectric body supportive of the first electrode or interposed between the second electrode and the non-conductive mesh, wherein:
the seating portion of the non-conductive mesh is configured to collect particles, the first and second electrodes are arranged such that, with the second electrode activated, a plasma field is generated to treat the particles in the seating portion and the seating portion being configured to retain the particles during treatment in opposition to ionic winds resulting from the plasma field.

13. The plasma treatment device according to claim 12, wherein the at least one dielectric body is supportive of the first electrode.

14. The plasma treatment device according to claim 12, wherein the at least one dielectric body is interposed between the second electrode and the non-conductive mesh.

15. The plasma treatment device according to claim 12, wherein the at least one dielectric body comprises:
a first dielectric body, which is supportive of the first electrode; and
a second dielectric body, which is interposed between the second electrode and the non-conductive mesh.

16. The plasma treatment device according to claim 12, wherein the particles comprise at least one of seeds and powder particles and the second electrode is operable at 10-500 kV/cm and with power densities ranging from 0.1-10 W/cm$^2$.

17. The plasma treatment device according to claim 12, wherein the non-conductive mesh is impermeable to the particles and porous to the ionic winds and to abnormally small or partial ones of the particles.

18. A method of operating a plasma treatment device, the method comprising:
supporting a first electrode on a dielectric body;
disposing a second mesh electrode having an opposite polarity from the first electrode and comprising a seating portion proximate to the dielectric body to define a gap receptive of particles for collection in the seating portion;
dispensing the particles into the gap such that the particles collect in the seating portion;
activating the second mesh electrode to generate a plasma field to treat the particles in the seating portion, the seating portion being configured to retain the particles during treatment in opposition to ionic winds resulting from the plasma field; and
pouring treated particles out of the seating portion and the gap following the treatment.

19. The method according to claim 18, wherein the dispensing comprises arranging the gap beneath a dispenser and opening the dispenser.

20. The method according to claim 18, wherein the pouring of the treated particles out of the seating portion comprises rotating at least the dielectric body and the second mesh electrode from a dispensing position to a tilted position.

* * * * *